United States Patent
Sin

(10) Patent No.: US 7,032,298 B2
(45) Date of Patent: Apr. 25, 2006

(54) APPARATUS FOR REPLACING DEFECTIVE PCB FROM PCB PANEL

(75) Inventor: Tae-Myung Sin, Chungcheongbuk-do (KR)

(73) Assignee: PCB Plus, Inc., (KR)

( * ) Notice: Subject to any disclaimer, the term of this patent is extended or adjusted under 35 U.S.C. 154(b) by 0 days.

(21) Appl. No.: 11/071,134

(22) Filed: Mar. 3, 2005

(65) Prior Publication Data
US 2005/0160594 A1 Jul. 28, 2005

Related U.S. Application Data

(63) Continuation of application No. PCT/KR03/01811, filed on Sep. 3, 2003.

(30) Foreign Application Priority Data

| Sep. 3, 2002 | (KR) | ............... 2002-52808 |
| Nov. 20, 2002 | (KR) | ............... 2002-72506 |
| Sep. 3, 2003 | (KR) | ............... 2003-61417 |

(51) Int. Cl.
*B23P 19/00* (2006.01)
(52) U.S. Cl. ............... 29/739; 29/402.8; 29/710; 29/712; 29/759; 29/834; 174/255; 361/792; 700/125
(58) Field of Classification Search ............... 29/402.3, 29/402.8, 426.3, 710–712, 721, 739, 743, 29/759–762, 832–834; 174/250, 255; 257/E21.526; 361/777, 784, 792; 438/67, 107; 700/121, 700/125
See application file for complete search history.

(56) References Cited

U.S. PATENT DOCUMENTS

| 4,549,200 A | * | 10/1985 | Ecker et al. ................. 174/260 |
| 4,588,468 A | * | 5/1986 | McGinty et al. ............... 29/829 |
| 5,773,764 A | | 6/1998 | von Vajna .................. 174/250 |
| 5,866,852 A | * | 2/1999 | Benz et al. ................. 174/255 |
| 5,897,334 A | * | 4/1999 | Ha et al. ..................... 438/107 |
| 5,953,216 A | * | 9/1999 | Farnworth et al. .......... 361/777 |
| 6,047,470 A | * | 4/2000 | Drussel et al. ................ 29/412 |
| 6,192,563 B1 | * | 2/2001 | Carr et al. ..................... 29/711 |
| 6,574,862 B1 | * | 6/2003 | Choi et al. ..................... 29/830 |

FOREIGN PATENT DOCUMENTS

| JP | 64-48489 | 2/1989 |
| KR | 1999-72847 | 5/1999 |
| KR | 2001-36622 | 5/2001 |

* cited by examiner

*Primary Examiner*—Minh Trinh
*Assistant Examiner*—Donghai D. Nguyen
(74) *Attorney, Agent, or Firm*—St.Onge Steward Johnston & Reens LLC

(57) ABSTRACT

The present invention relates to an apparatus for replacing a defective PCB unit formed on a PCB panel with a nondefective PCB unit, in which the location of the nondefective PCB unit disposed on a location correcting table is corrected by a location correcting driver via the location correcting data read by a vision camera, realizing a precise alignment in replacing the defective PCB unit without using a precise mechanical jig.

4 Claims, 7 Drawing Sheets

Prior Art

Prior Art defective PCB unit with a nondefective PCB unit will be briefly described hereinafter with reference to FIGS. 1 to 3.

APPARATUS FOR REPLACING DEFECTIVE PCB FROM PCB PANEL

This application is a continuation of pending International Patent Application No. PCT/KR2003/001811 filed Sep. 3, 2003, which designates the United States and claims priority of pending Korean Application Nos. 2002-52808 filed Sep. 3, 2002, 2002-72506 filed Nov. 20, 2002 and 2003-61417 filed Sep. 3, 2003.

FIELD OF THE INVENTION

The present invention relates to an apparatus and method for replacing a defective printed circuit board (PCB) unit formed on a PCB panel, and more particularly, to an apparatus and method for curing a PCB panel having a plurality of PCB units, when there is at least one defective PCB unit, by replacing the defective PCB unit with a nondefective PCB unit.

BACKGROUND ART

PCB units have been generally manufactured one by one. However, in recent years, in order to improve the productivity and yield in an automatic part mounting process, a plurality of PCB units having an identical pattern to each other have been printed on a single board and separated as a single unit after the part mounting process.

Such a board on which a plurality of PCBs are printed is called an arrayed PCB panel or simply a PCB panel and is classified into a 2-array PCB panel, a 3-array PCB panel, a 4-array PCB panel and the like according to the number of PCB units arrayed on the panel.

The PCB panel is designed such that each of the PCB units formed thereon is inspected on the defectiveness (before mounting part). When it is determined that at least one PCB unit is defective, the PCB panel is called an X-out PCB or an X-out board. The PCB panel determined as the X-out PCB has come into disuse. However, in recent years, a technique for replacing the defective PCB unit with a nondefective PCB unit, a process of which is called an X-out replacing process has been developed.

The X-out replacing process will be described hereinafter.

First, an electric current flow defectiveness, a surface scratch, a pattern dislocation, and the like are checked through an electric current flow test and a visual test using a magnifier with an enlargement scale of 5× or 10×, and the PCB units on the PCB panel, which are determined as a defective one, are marked by a letter "X."

Afterwards, a process for cutting away the defective PCB units is performed by a routing machine in which information on a cutting location, a cutting shape, and a cutting length are programmed considering a shape, thickness, junction strength of the PCB units.

Next, nondefective PCB units are precisely aligned on portions, which are defined by removing the defective PCB units from the PCB panel, in response to the original pattern. Here, the nondefective units are obtained from another PCB panel or extra PCB units that are specially manufactured.

After the above, adhesive is injected into portions defined by removing the defective PCB units using the routing machine to bond the nondefective PCB units on the PCB panel in a state where a tape is attached on the PCB panel to prevent the adhesive from overflowing. As the adhesive, epoxy resin is generally used. The epoxy resin is injected by a programmed fixed-quantity by a quantitative epoxy injector.

Then, the PCB panel in which the epoxy is injected is transferred into a hot wind drier. When the epoxy is hardened in the hot wind drier, the PCB panel is withdrawn from the drier and inspected for its twist and deformation at a room temperature, after which the location of the replaced PCB units is inspected using a three-dimensional measuring device. In addition, the scratch of the PCB units and spread of the epoxy are further inspected by naked-eyes using a magnifier.

In order to easily mount parts on the cured PCB panel using an automatic machine without any work error, part insertion holes formed on the nondefective PCB units should be accurately aligned on relative locations on the PCB panel in response to a circuit design or Gerber data. Therefore, the bonding process should be performed after the nondefective PCB units for replacing the defective PCB units are accurately aligned on the PCB panel. With the goods minimized, the PCB panel is also minimized with a high density. Therefore, the more precision process for aligning the nondefective PCB units on a portion formed by removing the defective PCB units from the PCB panel is required.

FIGS. 1 to 3 show a perspective view illustrating a conventional method for aligning and bonding a nondefective PCB unit on the PCT panel. As shown in the drawings, a PCB panel and a nondefective PCB unit for replacing a defective PCB unit are inserted into a plurality of fixing pins installed on a flat-shaped jig for the location alignment of the nondefective PCB unit with respect to the PCB panel.

The method for replacing the defective PCB unit with the nondefective PCB unit will be briefly described hereinafter with reference to FIGS. 1 to 3.

In FIG. 1, there is shown a 4-array PCB panel 200 having four PCB units 201. When it is intended to replace a defective PCB unit 201*a* among the four PCB units 201 with a nondefective PCB unit 201*b*, portions in vicinity of bridges 202 that are connection portions for connecting the defect PCB unit 201*a* to the PCB panel are first cut away together with the bridges 202 as shown in FIG. 1, thereby removing the defective PCB unit 201*a* from the PCB panel. That is, the cut-away portions including the bridges are extended enough toward the PCB panel. The cutting shape is designed considering a shape and thickness of the PCB unit and strength of a bonding portion of the (nondefective) PCB unit. In addition to the shape shown in FIG. 1, a variety of other shapes including a shape shown in FIG. 3 can be also possible.

The PCB panel 200 from which the defective PCB unit 201*a* is removed and a nondefective PCB unit 201*b* for replacing the defective PCB unit 201 a are coupled on the jig 100.

The jig 100 is made of a Bakelite plate 101 on which a plurality of fixing pins 107 are forcibly embedded. The fixing pins 107 are inserted into fixing holes 203 formed on the PCB units 201 and the PCB panel 200, thereby realizing the location fixture of the PCB units 201 and the PCB panel 200. In this state, the nondefective PCB unit 201 b is fixed on a portion defined by removing the defective PCB unit 201*a* from the PCB panel 200. At this point, the fixing pins 107 formed on the jig 100 is also inserted into holes formed on the nondefective PCB unit 201*b*, thereby aligning the nondefective PCB unit 201*b* on a location where the defective PCB unit 201*a* has been originally located.

After aligning the nondefective PCB unit 201*b*, epoxy is injected into spaces between the nondefective PCB unit 201*b* and the PCB panel 200 and hardened, thereby bonding the nondefective PCB unit 201*b* on the PCB panel 200.

However, since the location aligning precision between the nondefective PCB unit 201b for replacing the defective PCB unit 201a and the PCB panel 200 depends on only the fixing pins on the jig, there is a limitation to obtain enough locating precision, as a result of which the yield of the cured PCB panel is deteriorated.

That is, in order to manufacture a precise jig, an expensive precise drilling machine for drilling the fixing pin insertion holes each having a precise diameter at a precise location is required. In addition, the fixing pins embedded in the jig should be also precisely processed. However, even when the fixing pins and the fixing pin insertion holes are precisely processed, there may be some errors during the embedding process of the fixing pins into the fixing pin insertion holes. Namely, it is difficult to manufacture the precise jig required for the high density PCB panel. Furthermore, the jig plate may be easily deformed and the locations of the pins are easily displaced, causing the defectiveness of the PCB panel. When the jig is deformed, the whole body of jig should be replaced, increasing the manufacturing costs.

DISCLOSURE OF THE INVENTION

Accordingly, the present invention has been made in an effort to solve the above-described problems. An objective of the present invention is to provide an apparatus and method for replacing a defective PCB unit formed on a PCB panel, which can precisely align a relative location of a PCB panel with respect to a nondefective PCB unit for replacing the defective PCB unit without using a precise jig by correcting the relative location in real time.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an apparatus for replacing a defective PCB unit formed on a PCB panel with a nondefective PCB unit in which the nondefective PCB unit is bonded to a site where the defective PCB unit is removed, the apparatus comprising a location correcting table on which the nondefective PCB unit is disposed; a panel seating table, on which a PCB panel where the defective PCB unit is removed is disposed, the panel seating table being provided with a location correcting hole where the location correcting table is located; a seating table support on which the panel seating table is detachable installed by a fastener; a location correcting driver for driving the location correcting table relative to the panel seating table to correct location of the nondefective PCB unit with respect to the PCB panel; a vision camera for reading location of specific points on the nondefective PCB unit and the PCB panel respectively disposed on the location correcting table and the panel seating table; a reading location varying driver for sequentially moving the specific potions read by the vision camera below the vision camera; and a controller for controlling the location correcting driver and the reading location varying driver, receiving operation results of the vision camera, the location correcting driver and the reading location varying driver, and controlling, the location correcting driver by calculating location correcting data based on the operation results.

Therefore, the inventive apparatus for replacing a defective PCB unit formed on a PCB panel can precisely align a relative location of a PCB panel and a nondefective PCB unit for replacing the defective PCB unit without using a precise jig by correcting the relative location in real time.

According to another aspect of the present invention, there is provided a method for replacing a defective PCB unit formed on a PCB panel with a nondefective PCB unit in which the nondefective PCB unit is bonded to a site where the defective PCB unit is removed, the method comprising the steps of: removing the defective PCB unit from the PCB panel; disposing the nondefective PCB unit on a space of the PCB panel, which is defined by removing the defective PCB unit; reading a relative location of the nondefective PCB unit with respect to the PCB panel using a vision camera; and correcting a location of the nondefective PCB unit to an aligned location when it is determined from the reading result that the nondefective PCB unit is located out of the aligned location.

BRIEF DESCRIPTION OF DRAWINGS

The accompanying drawings, which are included to provide a further understanding of the present invention and are incorporated in and constitute a part of this application, illustrate embodiment(s) of the present invention and together with the description serve to explain the principle of the present invention. In the drawings.

DETAILED DESCRIPTION OF PREFERRED EMBODIMENTS

Preferred embodiments of the present invention will be described hereinafter in conjunction with the accompanying drawings.

It is to be understood that the following detailed description of the present invention are exemplary and explanatory and are intended not to limit the present invention.

Figure 1:
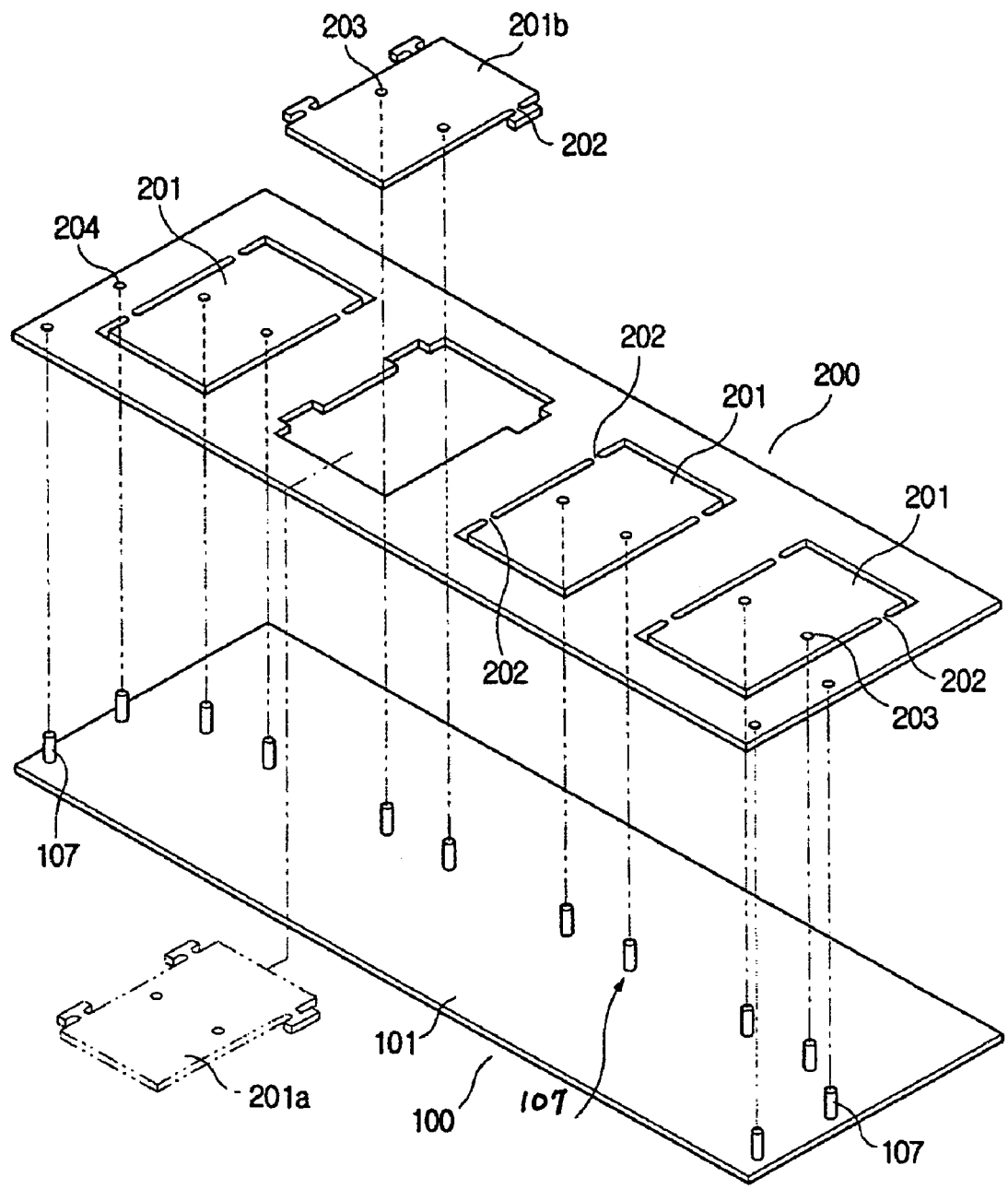
FIGS. 1 to 3 are schematic views illustrating a conventional method for replacing a defective PCB unit formed on a PCB panel with a nondefective PCB unit.
Figure 2:
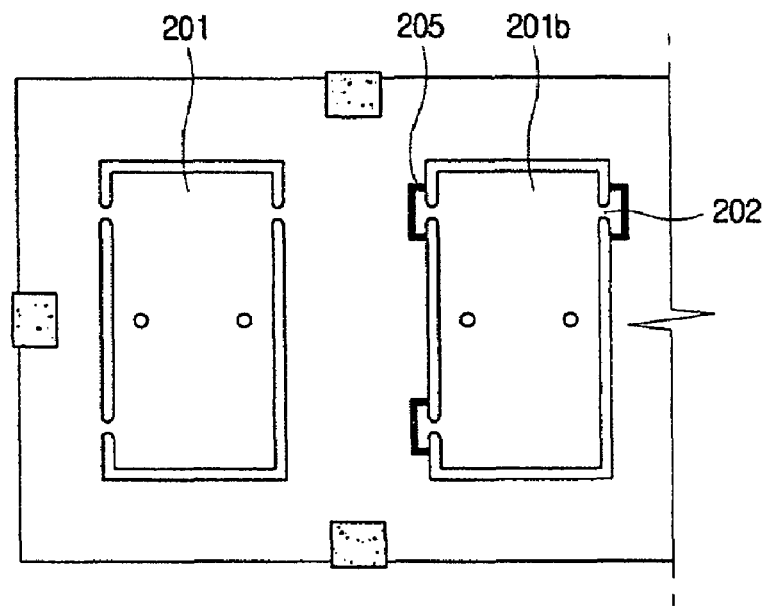
Figure 3:
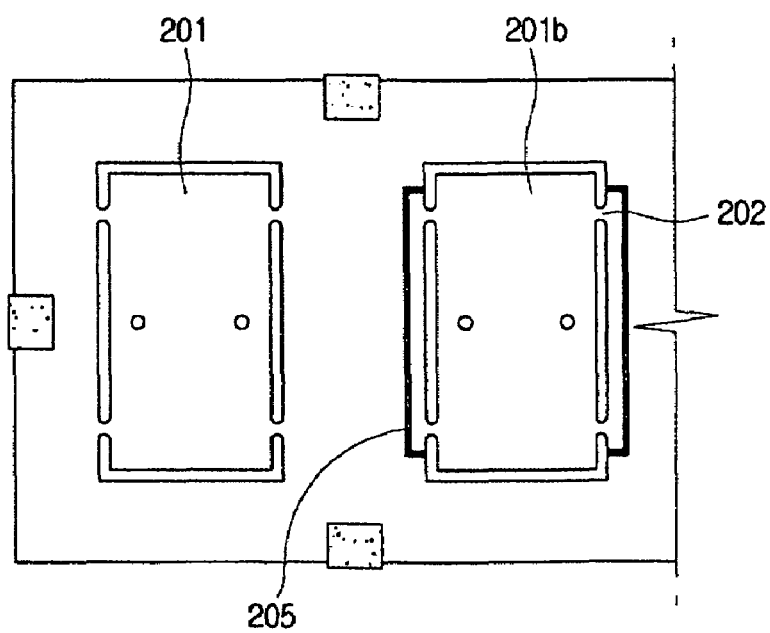
Figure 4:
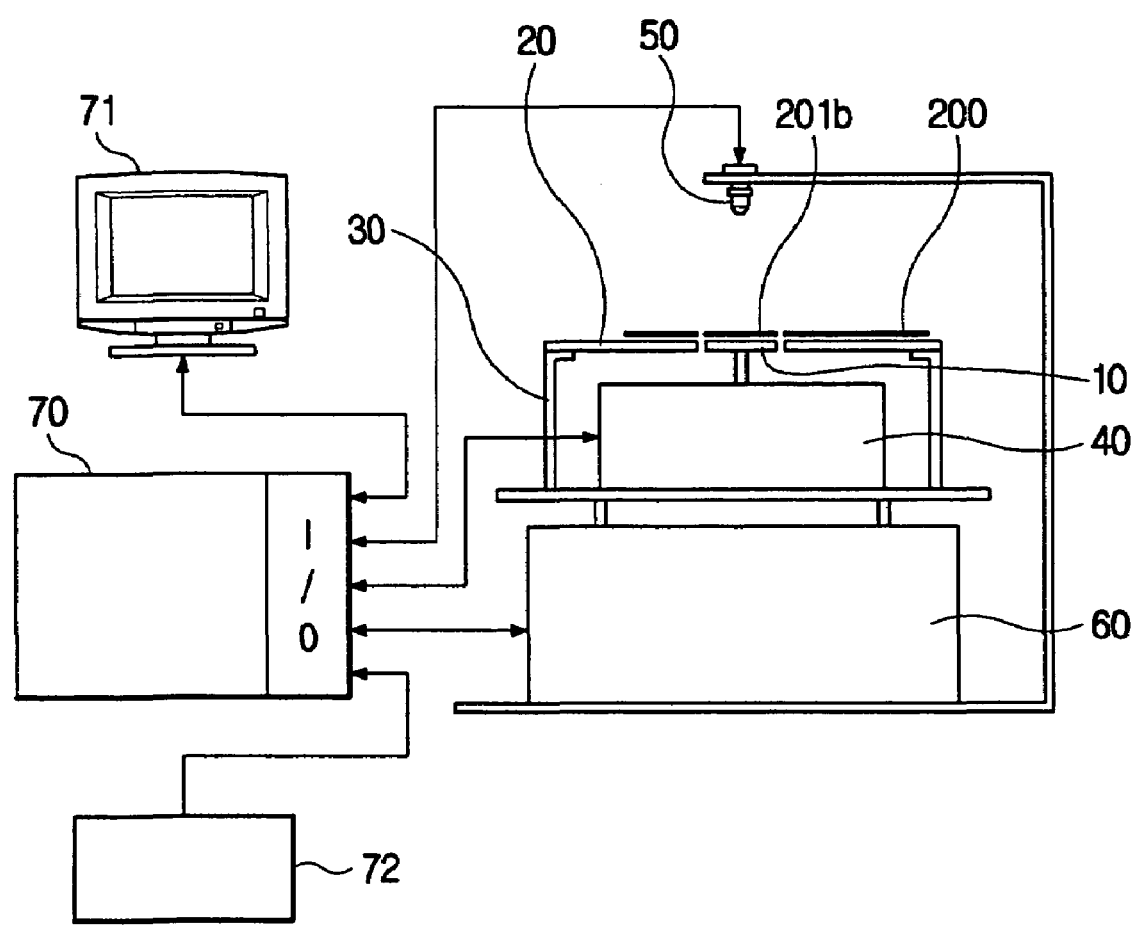
FIG. 4 is a block diagram of an apparatus for replacing a defective PCB unit formed on a PCB panel according to an embodiment of the present invention.
Figure 5:
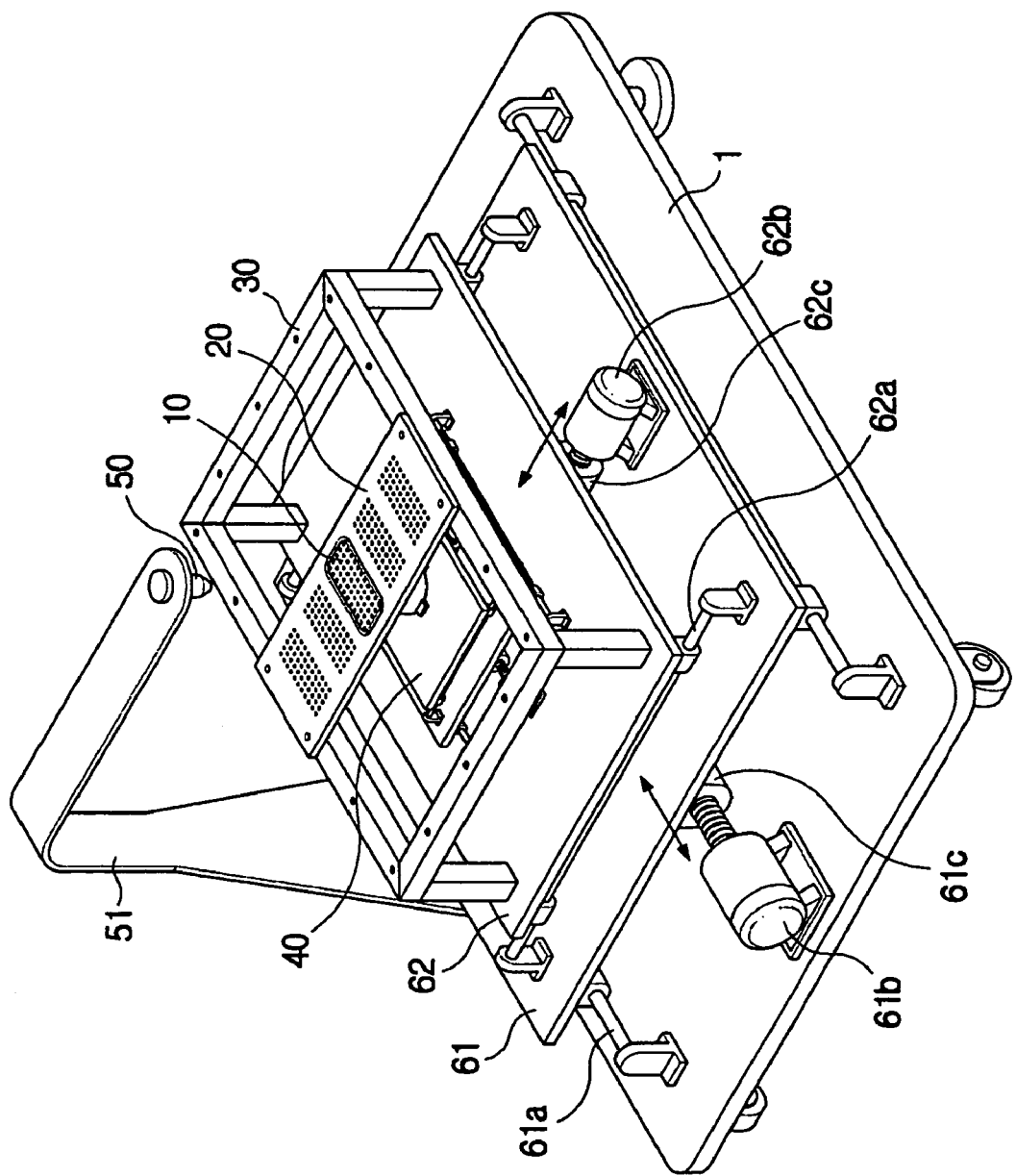
FIG. 5 is a perspective view of an apparatus for replacing a defective PCB unit formed on a PCB panel according to an embodiment of the present invention.
Figure 6:
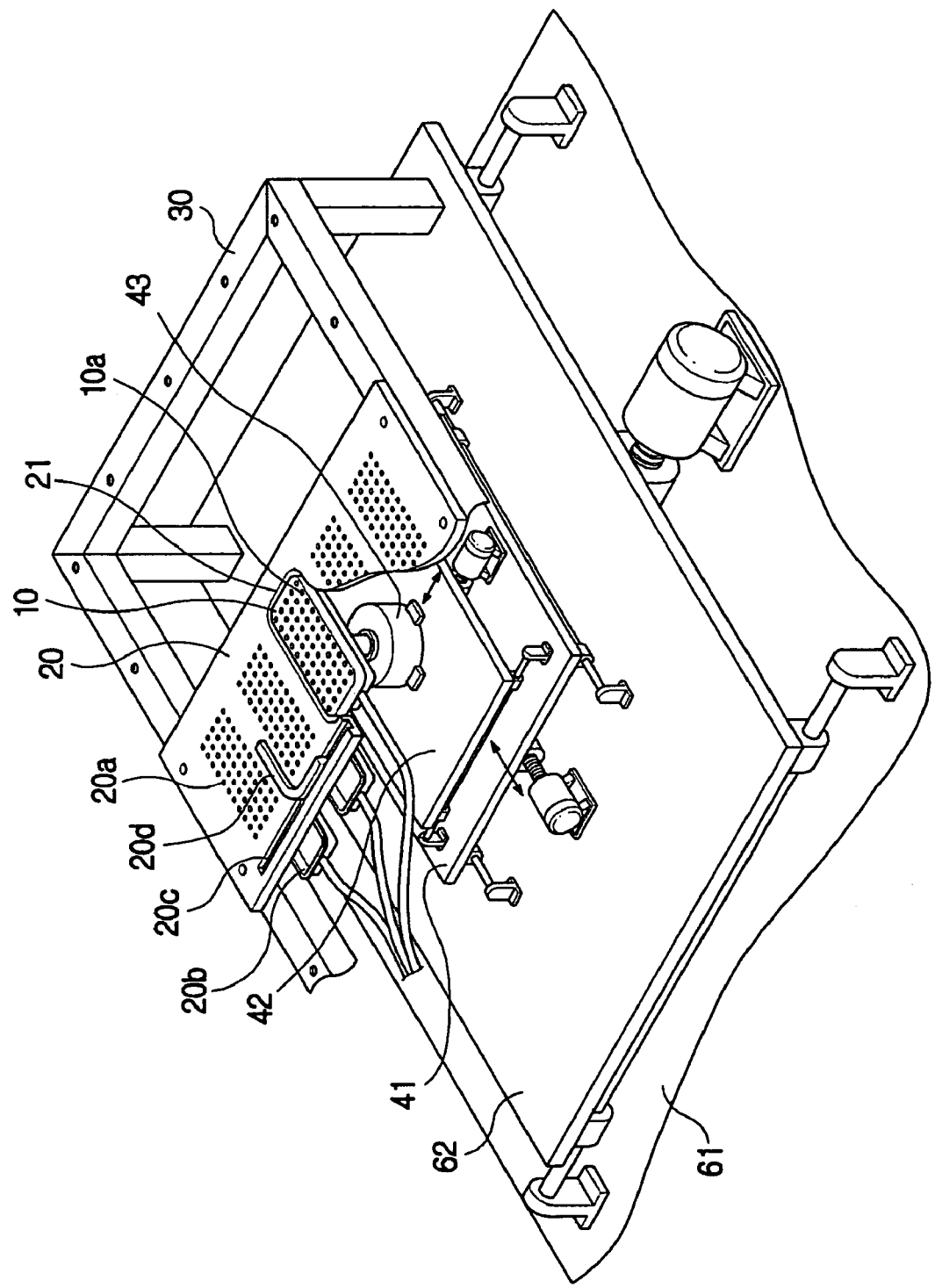
FIG. 6 is a partial sectional view of an apparatus for replacing a defective PCB unit formed on a PCB panel according to an embodiment of the present invention.
Figure 7:
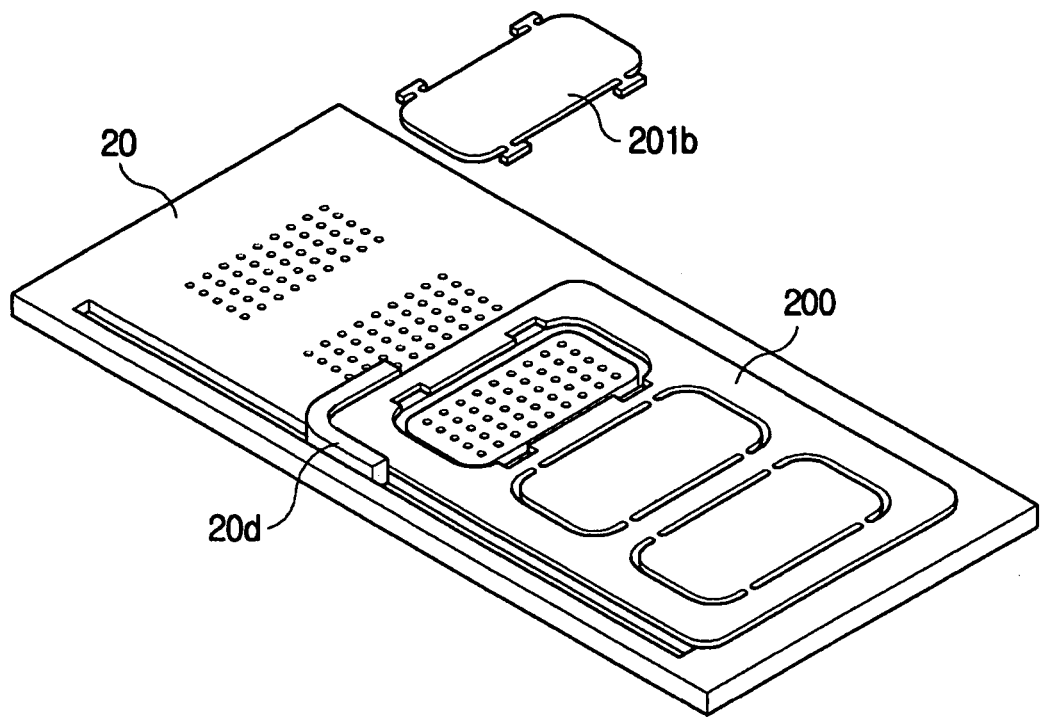
FIG. 7 is a view illustrating a nondefective PCB unit disposed on a PCB panel.
Figure 8:
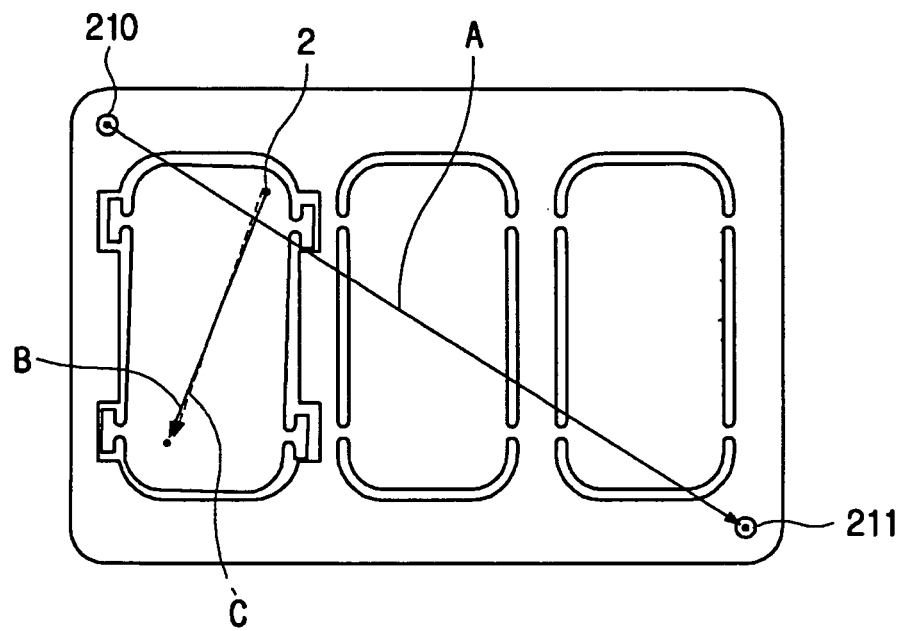
FIG. 8 is a view illustrating a location correction by a location vector of a PCB panel and a location vector of a nondefective PCB unit.
Figure 9:
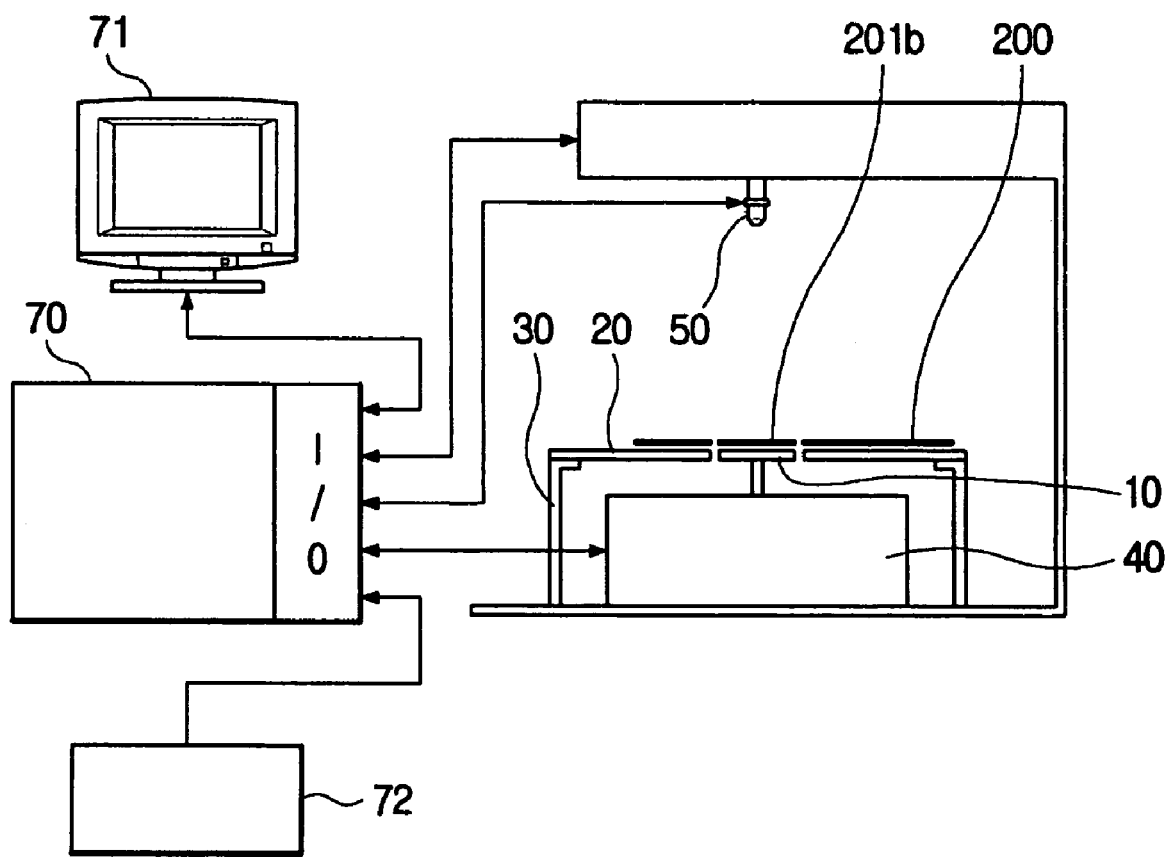
FIG. 9 is a block diagram of an apparatus for replacing a defective PCB unit formed on a PCB panel according to another of the present invention.

FIG. 4 shows a block diagram of an apparatus for replacing a defective PCB unit formed on a PCB panel according to an embodiment of the present invention, FIG. 5 shows a perspective view of an apparatus for replacing a defective PCB unit formed on a PCB panel according to an embodiment of the present invention, FIG. 6 shows a partial sectional view of an apparatus for replacing a defective PCB unit formed on a PCB panel according to an embodiment of the present invention, FIG. 7 shows a view illustrating a nondefective PCB unit disposed on a PCB panel, FIG. 8 shows a view illustrating a location correction by a location vector of a PCB panel and a location vector of a nondefective PCB unit, and FIG. 9 shows a block diagram of an apparatus for replacing a defective PCB unit formed on a PCB panel according to another of the present invention.

The inventive apparatus for replacing a defective PCB unit comprises a location correcting table 10 on which a nondefective PCB unit 201b for replacing the defective PCB unit is disposed; a panel seating table 20, on which a PCB panel 200 where the defective PCB unit is removed is disposed, provided with a location correcting hole 21 where the location correcting table 10 is located; a seating table support 30 on which the panel seating table 20 is detachable installed by a fastener such as bolts; a location correcting driver 40 for driving the location correcting table 10 relative to the panel seating table 20 to correct location of the nondefective PCB unit 201b with respect to the PCB panel 200; a vision camera 50 for reading location of specific points on the nondefective PCB unit and the PCB panel respectively disposed on the location correcting table 10 and the panel seating table 20; a reading location varying driver 60 for sequentially moving the specific potions read by the vision camera below the vision camera 50; and a controller 70 for controlling the location correcting driver 60(40) and the reading location varying driver 60, receiving operation results of the vision camera 50, the location correcting driver 40 and the reading location varying driver 60, and controlling the location correcting driver 40 by calculating location correcting data based on the operation results.

The controller 70 is formed of a computer or a PLC, comprising a video monitor 71 for displaying image information transmitted from the vision camera 50, a key pad 72 for inputting design and Gerber data required for the control and other required information, and a memory for storing input data and a process algorithm.

The location correcting table 10 and the panel seating table 20 are formed of a Bakelite plate or a transparent acryl plate. It is more preferable that the transparent acryl plate is used for the tables 10 and 20 so that the light illumination from the lower side can be possible. The tables 10 and 20 are respectively provided with a plurality of vacuum absorption holes 10a and 20a so that the PCB panel 200 and the nondefective PCB unit 201b that are disposed thereon can be stably supported by the vacuum absorption. Therefore, absorption cups 20b connected to a vacuum pump (not shown) to generate vacuum are disposed under the tables 10 and 20.

When the PCB panel 200 is disposed to be identical somewhat to predetermined data stored in the controller 70, the time for finding the reading points can be saved. Therefore, a guider 20d for guiding the seating location of the PCB panel 200 is slidably installed in a guide groove 20c formed on the panel seating table 20.

The location correcting driver 40 and the reading location varying driver 60 are not limited to a specific structure. That is, any structure that allows the reciprocation motion in a direction of an X-Y coordinate or the rotational motion can be employed. In this embodiment, the reading location varying driver 60 comprises a first support 61 guided by a guide rail 61a and reciprocating by a driving motor 61b and a ball screw 61c, and a second support 62 disposed above the first support 61 and perpendicularly reciprocating with respect to the first support 61 by a guide rail 62a, a driving motor 62b and a ball screw 62c. The seating table support 30 and the location correcting driver 40 are installed on the second support 62, thereby displacing in the direction of the X-Y coordinate. As another embodiment of the present invention, it is also possible that the vision camera 50 is designed to be driven by the reading location varying driver 60 as shown in FIG. 9.

The location correcting driver 40 is designed to be rotatable by a step motor 43 installed on supports 41 and 42 movable in the direction of the X-Y coordinate. It is more preferable that the location correcting driver 40 is designed to move in a vertical direction so that the nondefective PCB unit 201b can be easily seated.

A method for replacing a defective PCB unit formed on the PCB panel with the nondefective PCB unit will be described hereinafter together a description of the operation of the above-described apparatus.

First, the PCB panel 200 in which the defective PCB unit is already removed is disposed on the panel seating table 20 such that a space defined by removing the defective PCB unit can be located on the location correcting hole 21 and a left-lower end of the PCB panel 200 contacts the guider 20d. Next, the nondefective PCB panel 201b for replacing the defective PCB unit 201a is disposed on the location correcting table 10.

At this point, the PCB panel 200 and the nondefective PCB unit 201b are securely fixed on the tables 10 and 20 by the vacuum-absorption formed through the vacuum absorption holes 10a and 20a.

Afterwards, the location correcting table 10 and the panel seating table 20 are driven by the reading location varying driver 60 such that central points of Fiducial marks 210 and 211 of the PCB panel can be read by the vision camera 50. The central points read by the vision camera 50 can be stored in the controller 70. The controller calculates a location vector A interconnecting the central points. Predetermined two points on the nondefective PCB unit are also read and a location vector B of the predetermined two points is calculated and stored in the controller 70. The predetermined two points of the nondefective PCB unit may be part insertion holes or points formed on a print pattern.

The controller 70 operates the location correcting driver 10 such that a location of the vector B relative to the vector A can be located on an aligned location C, thereby automatically realizing the location correction.

Afterwards, the nondefective PCB unit 201b and the PCB panel 200 are connected to each other by a tape while maintaining their locations. At this point, the taping direction, angle and length are determined considering the expansion coefficient of epoxy such that the nondefective PCB unit 201b is not displaced in any of X, Y and Z-directions by the expansion of the epoxy that will be injected and dried in a gap defined between the nondefective PCB unit 201b and the PCB panel 200.

Next, the epoxy is injected into a gap between the nondefective PCB unit 201b and the PCB panel 200 that are connected by the tape. For this process, the connected nondefective PCB unit 201b and the PCB panel 200 are upset with one side of the gap being closed by the tape, and a predetermined amount of the epoxy is injected into the gap through the other side of the gap by a quantitative epoxy injector.

Afterwards, the PCB panel in which the epoxy is injected is dried in an oven. When the tape is deformed during the drying process, the corrected location of the nondefective PCB unit 201b disposed on the PCB panel 200 may be displaced. Therefore, the tape should be formed of a material that is not deformed even at a high temperature. After the PCB panel is dried, the tape is removed, thereby completing the cured PCB panel in which the defective PCB unit is replaced with the nondefective PCB panel.

As described above, the inventive apparatus for replacing the defective PCB unit is designed to realize a precise alignment in replacing the defective PCB unit without using a mechanical jig. Therefore, it is possible to manufacture the high precise and uniform products, improving the productivity and yield. In addition, since the jig is not used, the time and expense for manufacturing and maintaining the jig is not required, saving the manufacturing costs of the PCBs. In addition, the processes for replacing the defective PCB unit is simplified and automatized, the manufacturing costs of the PCBs can be further reduced.

What is claimed is:

1. An apparatus for replacing a defective printed circuit board (PCB) unit formed on a PCB panel with a nondefective PCB unit in which the nondefective PCB unit is bonded to a site where the defective PCB unit is removed, the apparatus comprising:
    a location correcting table for replacing the defective PCB unit with the nondefective PCB unit;
    a panel seating table for placing a PCB placing a PCB panel and removing of defective PCB unit, the panel seating table being provided with a location correcting hole where the location correcting table is located;
    a seating table support on which the panel seating table is detachable installed by a fastener;
    a location correcting driver for driving the location correcting table relative to the panel seating table to correct location of the nondefective PCB unit with respect to the PCB panel;
    a vision camera for reading location of specific points on the nondefective PCB unit and the PCB panel respectively disposed on the location correcting table and the panel seating table;
    a reading location varing driver is located below the vision camera for sequentially moving the specific points read by the vision camera; and
    a controller for controlling the location correcting driver and the reading location varying driver, receiving operation results of the vision camera, the location correcting driver and the reading location varying driver, and controlling the location correcting driver by calculating location correcting data based on the operation results.

2. The apparatus of claim 1, wherein the reading location varying driver is disposed under the seating table support to move the seating table support relative to the vision camera.

3. The apparatus of claim 1, wherein the specific points are two Fiducial marks formed on the PCB panel and predetermined two points formed on the nondefective PCB unit, and the controller operates the location correcting driver such that a relative location of a vector interconnecting the Fiducial marks and a vector interconnecting the predetermined two points is displaced to an aligned location.

4. The apparatus of claim 1, wherein the location correcting table and the panel seating table are provided with a plurality of vacuum absorption holes, and vacuum cups connected to a vacuum pump are disposed under the location correcting table and the panel seating table.

* * * * *